United States Patent [19]

Korhonen et al.

[11] Patent Number: 5,446,417
[45] Date of Patent: Aug. 29, 1995

[54] CONTROLLED OSCILLATOR

[75] Inventors: Veijo Korhonen; Olli Haapaporras, both of Oulu, Finland

[73] Assignee: Nokia Mobile Phones Ltd., Salo, Finland

[21] Appl. No.: 44,279

[22] Filed: Apr. 7, 1993

[30] Foreign Application Priority Data

Apr. 15, 1992 [FI] Finland ................................ 921706

[51] Int. Cl.[6] .............................................. H03B 5/24
[52] U.S. Cl. .................................... 331/57; 327/276; 327/281
[58] Field of Search ............... 331/57; 307/597, 603; 327/276, 278, 281, 283

[56] References Cited

U.S. PATENT DOCUMENTS

| | | | |
|---|---|---|---|
| 4,072,910 | 2/1978 | Dingwall et al. | 331/57 |
| 4,105,950 | 8/1978 | Dingwall | 331/57 |
| 4,388,536 | 6/1983 | Peil et al. | 331/57 |
| 4,408,168 | 10/1983 | Higuchi | 331/57 |
| 4,686,489 | 8/1987 | Caspell | 331/57 |
| 4,820,943 | 4/1989 | Makino et al. | 307/603 |
| 4,978,927 | 12/1990 | Hausman et al. | 331/57 |
| 5,045,811 | 9/1991 | Lewis | 331/1 A |
| 5,081,428 | 1/1992 | Atriss et al. | 331/57 |

FOREIGN PATENT DOCUMENTS

| | | |
|---|---|---|
| 0171022A3 | 2/1986 | European Pat. Off. . |
| 0236525A1 | 9/1987 | European Pat. Off. . |
| 0294203A3 | 12/1988 | European Pat. Off. . |
| 1921706 | 12/1992 | Finland . |
| 2928430 | 1/1980 | Germany . |

OTHER PUBLICATIONS

Patent Abstracts of Japan, vol. 10, No. 117, (E-400) (2174) 2 May 1986, & JP-A-60 250 712 (Toshiba K.K.) 11 Dec. 1985.
Patent Abstracts of Japan, vol. 10, No. 213 (E-422) (2269) 25 Jul. 1986, & JP-A-61 52 022 (Hitachi Ltd.) 14 Mar. 1986.

*Primary Examiner*—Andrew M. Dolinar
*Attorney, Agent, or Firm*—Perman & Green

[57] ABSTRACT

A controlled oscillator comprising a delay chain having a plurality of series coupled delay lines, the output of the delay chain being fed back as an input to each of the delay lines. Each delay line comprising an invertor such that the delay imparted by the invertor is controlled by a voltage controlled resistance means. The length of the delay chain is controlled by a selection control means which in turn controls the frequency range of operation of the oscillator.

6 Claims, 6 Drawing Sheets

CONTROLLED OSCILLATOR

The present invention relates to a controlled oscillator.

BACKGROUND OF THE INVENTION

In theory, an oscillator comprises a resonant circuit, i.e. usually a resonant circuit formed by a parallel or series connected inductance (L) and capacitance (C). For its oscillation, two conditions have to be met: the sum of the amplification and losses of the circuit must be zero and the closing the loop must invert the phase by 180 degrees. In practice, an oscillator can be implemented, for instance, with reactive components forming an LC resonant circuit, said components determining the oscillation frequency, and with negative resistance annulling the resistive losses thereof, said resistance being formed with a transistor and a feedback capacitor.

A resonant circuit may also be implemented using a crystal oscillator in which the resonant frequency is determined on the basis of the piezoelectric properties. A directly feedback, phase-inverting amplifier, i.e. ring oscillator may also be used. The oscillation frequency of a reactive oscillator is $f_{res} = 1/(2\pi\sqrt{LC})$, so that the oscillation frequency can be controlled by changing the capacitance of the circuit, e.g. using a capacitance diode, i.e. vatactor, in the resonant circuit. It is well known that the capacitance thereof is dependent on the value of the reversed voltage affecting there through. When a feedback amplifier is in question, the delay of the amplifier can be controlled, said change causing a change in the oscillation frequency.

Voltage controlled oscillators (VCO) are particularly well suited for use in a phase-locked loop as mentioned above. Their use is therefore common in multi-channel radio apparatus frequency synthesizers because therewith it is convenient to generate different frequencies as required. In a phase-locked loop the voltage obtained from the phase comparator of the loop forms the control voltage of the oscillator. State of the art oscillators have been implemented with discrete components, so that separate components have to be used in all applications employing a phase-locked loop. The oscillator is, in addition to the loop filter, an obstacle to the complete integration of the phase-locked loop. The number of discrete components can be somewhat reduced by employing commercially available, prefabricated, plastic-encapsulated integrated VCO circuits. However, they require an external, a so-called tank circuit, charging and discharging which the oscillation is based on. The tank circuit consists of an inductance, a capacitor and a capacitance diode, which cannot have been totally integrated on silica, so that no one has managed to build a complete oscillator implemented in the form of an IC circuit.

The above oscillator circuits known in the art are encumbered with certain drawbacks. The oscillator is highly sensitive to disturbances and in implementing it, especially in RF applications, particular attention has to be paid to protection against disturbances caused by electromagnetic interference (EMI). In direct frequency modulation in which the modulating signal is directly summed with the control voltage of the voltage controlled oscillator, the modulating signal must be filtered and its level has to be maintained sufficiently low. The aim of said operations is to improve the signal/noise ratio of the oscillator. In radio phone applications of the oscillator, the discrete components employed constitute a restriction to complete integration of the voltage controlled oscillator, and consequently, that of the synthesizers. In integrating PLL circuits, creating the requisite high filtering time constants is also difficult to accomplish. A drawback related to oscillators known in the art is also that the frequency range within which an oscillator can be controlled is rather narrow. It would be highly advantageous if such wide frequency range could be provided for in one and same oscillator that the same oscillator could be used in different applications. As to radio phones, this means that in different telephone versions one oscillator could be used instead of version-specific oscillators, as is common practice nowadays. With the means currently used such an oscillator can be constructed in which the frequency range is very wide but then the VCO coefficient (frequency/voltage) has to be great. In such instance, the signal/noise ratio is also small so that the oscillator is readily modulated by noise and various interference signals, and a sufficient frequency standard of purity is not reached. Typically, the frequency of the oscillators known in the art can be controlled only in the range 20 to 60 MHz.

SUMMARY Of THE INVENTION

According to the present invention there is provided a controlled oscillator comprising a delay line in the form of a plurality of coupled delay elements, each delay element comprising a pair of coupled invertors characterized in that a controllable resistance means is coupled between at least one invertor in each pair of coupled invertors and ground, such that the invertor will discharge through said resistance means, whereby the decay time of the invertor, and thus the oscillator frequency will be determined by the magnitude of the resistance means.

An advantage of the present invention is the provision of a general-purpose, voltage-controlled oscillator, not encumbered with the drawbacks of the designs known in the art, and capable of being integrated on silicon. Its frequency range should be extremely large because of the multiple-use requirement, but it should have a high degree of frequency purity. The power consumption should be low. In a particularly advantageous embodiment, the oscillator includes a plurality of delay lines. The length of an oscillator ring, i.e. oscillation frequency range, can be so selected digitally that the state of the control lines determines how many delay lines are included in a delay chain.

The information is made use of in the invention that the delay of a pulse passed through a CMOS invertor can be controlled by changing the resistance through which the energy of the invertor charged in the capacitances is discharged when the edge of the pulse from the invertor decays. Such delay elements produced with invertors are placed in succession, whereby a delay chain of a desired length is produced. A desired number of delay lines are placed one after the other to form a delay chain. From the output of a delay chain an output signal has been conducted to the beginning of each delay line. The input of each delay line is therefore the output of a preceding delay line and the output of the entire chain. By means of an external selection signal it is possible to select which one of the inputs is coupled to the delay line, and so to select how many delay lines are included in a chain. As described above, the delay of a delay line can be controlled by controlling with the control voltage the resistance through which the energy of the delay element is discharged. In this manner, a ring oscillator of desired length provided with a given frequency range is produced in which the oscillation frequency can be controlled. According to the number of the delay lines, there may be several frequency ranges, and they can be arranged to be partly overlapping. In an embodiment, the frequency range of the oscillator can be expanded by positioning a divider in the feedback branch of the output signal to divide the frequency before taking it to the beginning of each delay line. The divider is preferably programmable, and its divisor is determined by an external control word carried to the divider.

Several possibilities are available for implementing controllable resistances. First, it can be carried out using one FET transistor.

Secondly, in an embodiment here presented, controllable resistances connected in parallel are used, with one of which the actual discharge current is controlled and the other one is used as the bias resistance for limiting the maximum delaying of the pulse edge and for placing it to be the desired one when the control voltage is zero. When this kind of control is used, the minimum frequency of the oscillator can be increased and the VCO coefficient limited.

In a third embodiment, the control can be implemented by limiting the discharge current with the aid of a voltage controlled current source (VCCS) and a current-controlled current source (CCCS). The control voltage is carried to the voltage/current converter (VCCS), from which the desired current is mirrored for instance with the aid of a current mirror to become the discharge current of the invertor stage. Even in said embodiment, the discharge current can be divided into parallel control current and biassing current.

Since consecutive delay lines are used in the present invention, each comprising a plurality of delay elements implemented with invertor pairs, a circuit has to be positioned at the beginning of each line, said circuit, according to the logical state of the selection line entering thereto, allows either the output pulses of a preceding line or the pulses carried from the output of the circuit with a feedback branch to enter the delay line. As many selection lines as there are delay chains are provided. It is most preferred to use a decoder to code the external control into the state of the selection lines. Now, for instance by means of a two-bit external control, one to four selection lines can be selected for the length of the ring oscillator. The decoder can be implemented using any technique known in the art, and it is most preferred to integrate it together with the oscillator.

BRIEF DESCRIPTION OF THE DRAWINGS

An embodiment of a voltage controlled oscillator is described below in detail, by way of example, with reference to the accompanying drawings, in which.

DETAILED DESCRIPTION OF THE INVENTION

Figure 1:
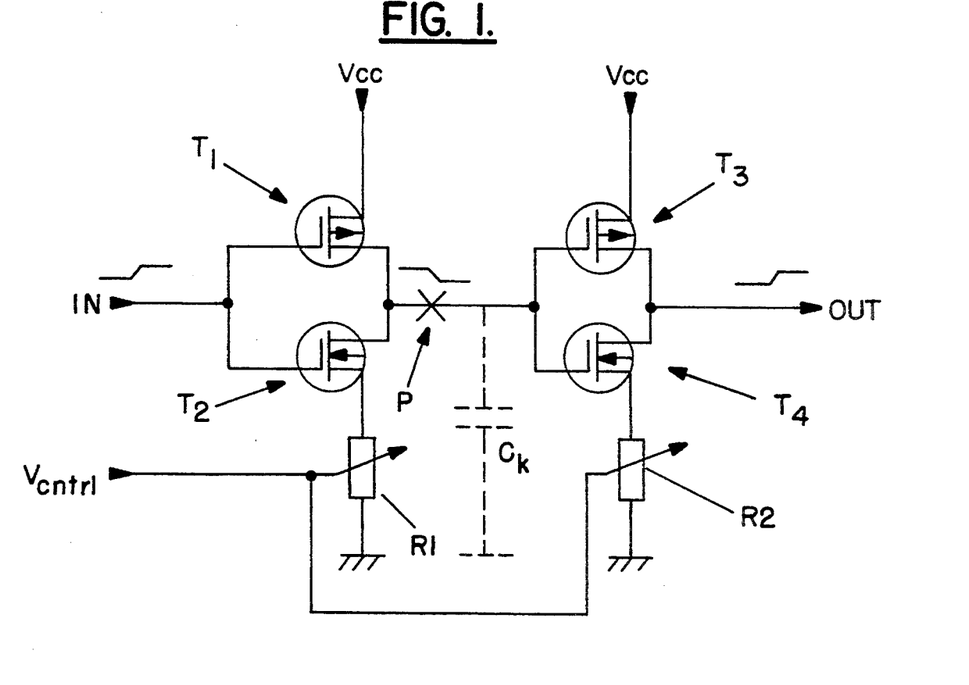
FIG. 1 illustrates the principle circuit of one controllable delay element.

In order to understand better the functioning of an individual delay element, reference is made to FIG. 1. An element comprises two consecutive invertors $T_1$, $T_2$ and $T_3$, $T_4$ implemented using two transistors and being in itself known in the art. A complement-symmetrical MOS invertor comprises a PMOS transistor $T_1$ serving as a load and an NMOS transistor $T_2$ serving as a switch, the drains thereof, as well as the gates, have been mutually connected. The operating voltage $V_{cc}$ is connected to the source of the PMOS transistor serving as the load, and the source of the NMOS transistor serving as the switch is grounded. An incoming pulse IN is carried to the combined gate and the inverted output pulse is derived from the combined drain at point P. When the input pulse is down, the voltage is up at point P because $T_1$ is conducting and $T_2$ is non-conducting. Together with a rise in the voltage of the input pulse, $T_2$ becomes conducting, $T_1$ shuts off and the voltage of point P descends to almost zero on the condition that $R_1$ is not infinite. The lead capacitance $C_k$ of the circuit, being via $T_1$ charged to the full value, is presented in the form of concentrated capacitance as a reference with broken lines, and it consists mainly of the gate capacitances of the degree to be controlled, the stray capacitances of the wiring, and the diffusion capacitances of the transistor output, and together with the resistances of the inverter and the resistor $R_1$ it determines the rise and decay times of the output voltage of the invertor. The time between the changes of the input and output voltages is determined as the delay of the pulse in the inverter when the voltages reach the 50 per cent level. The particular aspect is made use of in the present invention that by placing between the source of the transistor $T_3$ and the ground a resistor $R_1$ controlled with a control voltage $V_{cntrl}$, preferably a FET transistor, the discharging rate of lead capacitance $C_k$ can be controlled by controlling the resistance $R_1$ because the lead capacitance $C_k$ is discharged through $T_2$ and $R_1$. In this manner the unit delay of the inverter can be controlled by controlling the decay time of the pulse edge. When one wants that the pulse phase maintains and also that the rise time of the rising pulse edge is controlled in like manner, after a first inverter to be controlled a second inverter is added, i.e. a transistor pair $T_3$, $T_4$ and a controllable resistance $R_2$. With said arrangement the inverted delayed pulse is returned as it was originally and the decaying edge is delayed, resulting in a symmetrical pulse delayed from the original.

Figure 2:
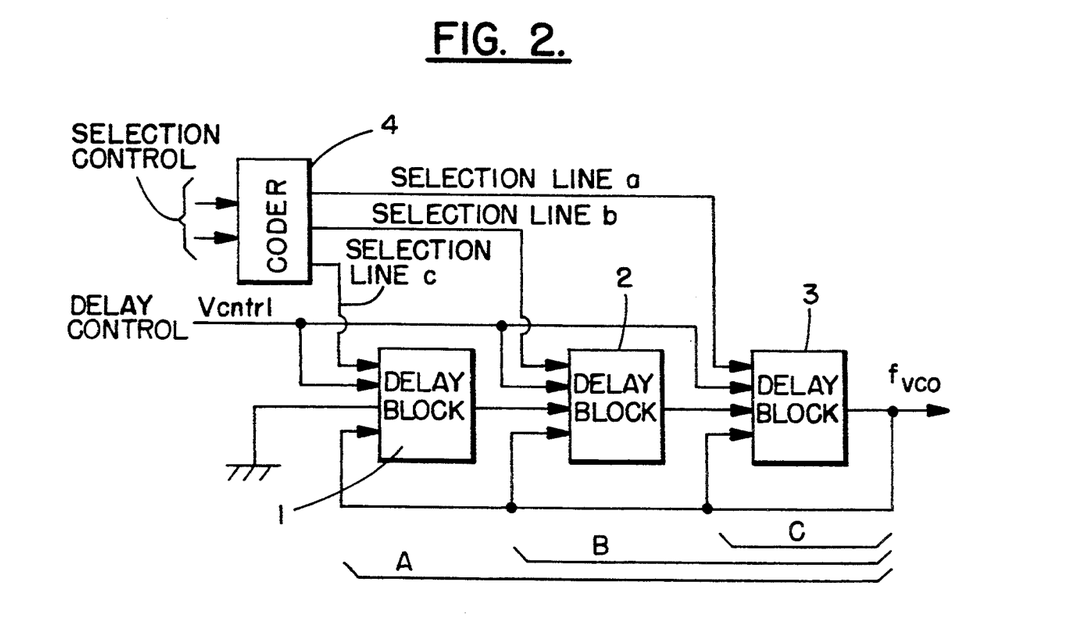
FIG. 2 illustrates a schematic circuit of a ring oscillator.

The principle structure of the delay element shown in FIG. 1 has already been described above. The circuit in FIG. 2 illustrates a delay chain consisting of consecutive delay blocks 1, 2 and 3 forming a delay line. A desired number of delay elements are included in the delay lines, and the number of the elements per line can be the same or it may also be different. From the output of the last delay block 3 of the chain the output frequency $f_{vco}$ of the oscillator is derived which is carried with a feedback branch also to one of the inputs of each delay block 1, 2 and 3. The second input of each delay block is formed by the control voltage $V_{cntrl}$ of the delay derived from outside the oscillator, e.g. from a logic or equivalent, in a PLL instance from a loop phase comparator. How the control voltage is formed is not included within the sphere of the present invention. A third input of each delay block is a selection line from the decoder, this being specific to each delay line, e.g. the selection line b enters the beginning of the delay block 2. The state of the selection line determines whether it is the pulses from a preceding line (the case of delay blocks 2 and 3) which are conducted to the delay chain of the block or the output signal of the oscillator $f_{vco}$. The input of the first delay block 1 which in the other blocks is equivalent to the input of the preceding delay line is grounded. The selection lines a, b and c enter from the decoder 4. Its input is in turn formed by two selection control lines, so that the lines are provided with four different combinations. The coder 4 codes the input so that only one of the selection lines is in a different state.

Let us assume that the selection line b is in state "0" while the others are in state "1". Now, the gates acting as switch elements for the block 2 let the output signal $f_{vco}$ of the oscillator pass into a delay line but not the output of the preceding delay block 1. The state "1" of the selection line a causes that the output of the delay line of block 2 but not the output signal $f_{vco}$ of the oscillator is connected to the delay line of block 3. The state "1" of the selection line c causes that the input of the delay line thereof is connected to the ground of the circuit so that no pulses are derived from block 1. In this manner the delay line of the oscillator comprises the delay lines of delay blocks 2 and 3. When the control voltage $V_{cntrl}$ of the delay common to all blocks is controlled, the delay of the delay chain is changed, and respectively, also the frequency of the oscillator.

In this manner one of the three oscillator rings of different lengths can be selected for use with the aid of the selection lines a, b and c and the frequency therein controlled with the control voltage $V_{cntrl}$ of the delay. This means that three frequency bands are obtained inside which the frequency of the oscillator can be controlled. This is outlined in FIG. 6 in which by selecting the length of the ring the entire frequency range can be divided into three partial ranges A, B and C which partly cover one another. The highest oscillation frequency $f_{vco}$ is obtained when the length of the ring is shortest, i.e. only the delay block 3 is used. By controlling the delay in said block with the control voltage $V_{cntrl}$, the frequencies in range C can be formed. Respectively, when the length of a ring is greatest, that is, all three delay blocks are in use, a frequency range A can be formed and frequency range B can be formed in delay blocks 2 and 3.

Figure 3:
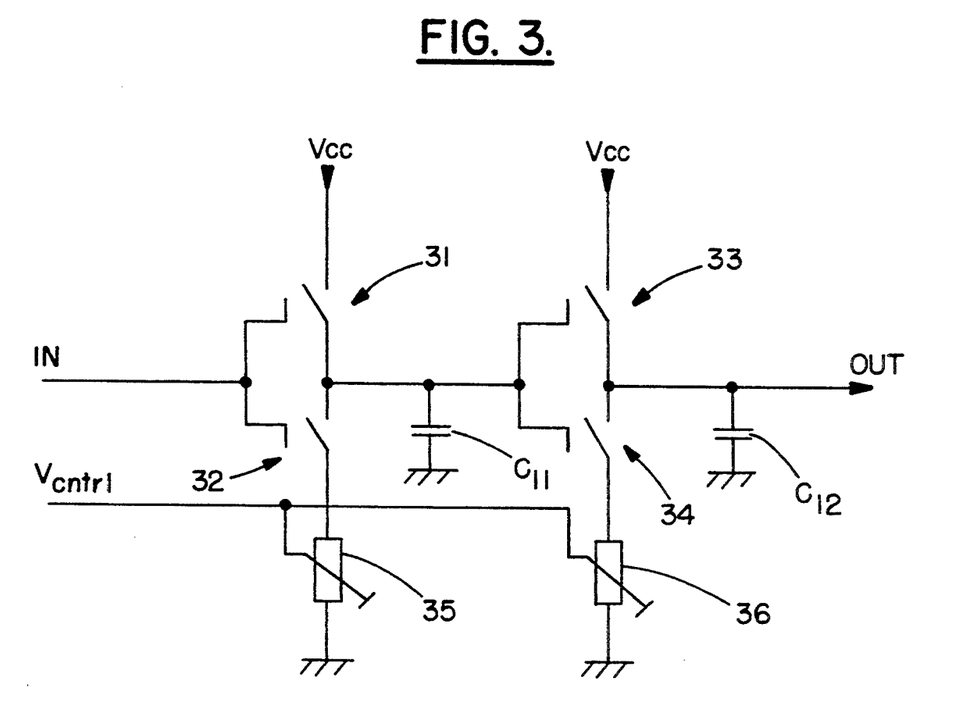
FIG. 3 illustrates the structure of one delay element.

Reference is next made to FIG. 3 which shows the structure of a delay element to be controlled, which to a large extent is equivalent to the general principle shown in FIG. 1. Accordingly, an element comprises two invertors, the FET switches of the first one being indicated by reference numerals 31, 32, and the switches of the second one respectively, with reference numerals 33, 34. A pulse enters the input In and a delayed pulse is obtained from the output Out. According to the description of FIG. 1 the discharge current of both invertors is controlled with resistors 35 and 36 controlled with voltage $V_{cntrl}$. Said resistors have been implemented using the semiconductor technique and they can be e.g. FET or bipolar transistors. Depending on the application, it may turn out to be necessary to increase the load capacitance of the invertor formed by stray capacitances (not shown) and therefore, a capacitance can be added after each invertor. After the first one the capacitance $C_{11}$ is added and after the second one, the capacitance $C_{12}$. Although the designer may exert an influence on the stray capacitances, because most of these are dependent on the geometry, it is preferred to add said capacitances $C_{11}$ and $C_{12}$ which are greater than the load capacitances. When the values of the resistors 35 and 36 and the values of the capacitances $C_{11}$ and $C_{12}$ are higher than the correspondent stray quantity values, managing the discharge current is easier because the time constant of a discharge is RC. The functioning of the delay element shown in FIG. 3 is equivalent to the functioning of the design shown in FIG. 1 so that reference is only made thereto.

Figure 4:
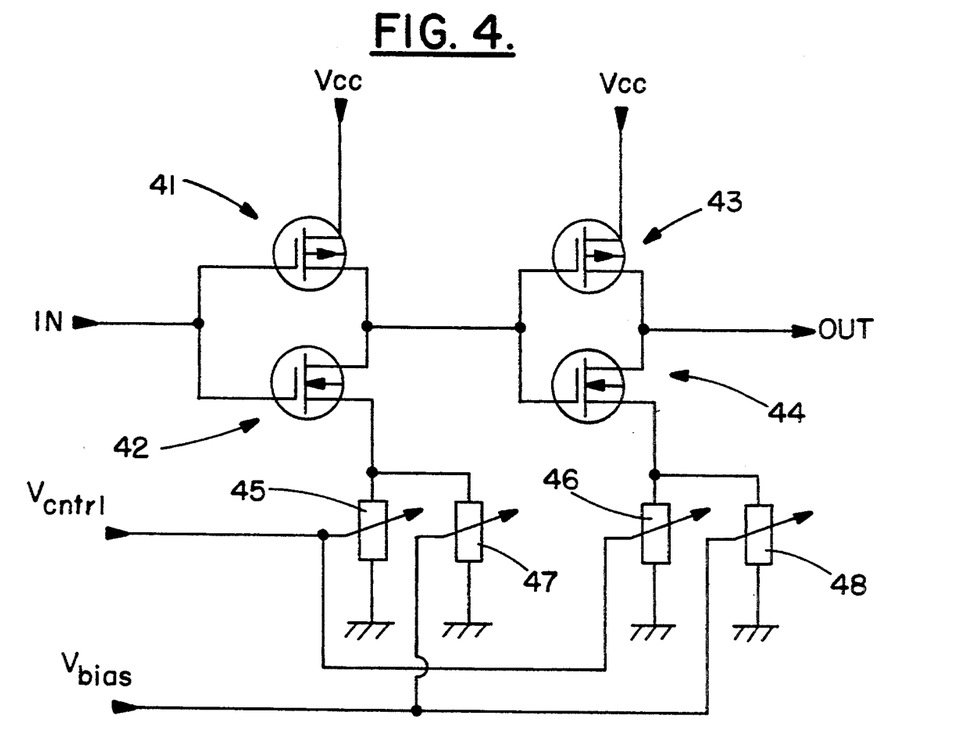
FIG. 4 presents a second embodiment of controlling the delay.

The second embodiment of the discharge current as shown in FIG. 4 differs from the design in FIG. 3 in that parallel-connected controllable resistances substitute for the resistances 35 and 36 of the controllable invertor stage. The discharge current of the invertor pairs 41, 42 and 43, 44 is divided between the parallel-connected controllable resistances 45 and 47 located between the NMOS transistor of both pairs and the ground, and respectively, between the resistances 46 and 48 in proportion to the resistances. The resistances 47 and 48 act as bias resistances, the resistance value thereof being selected with voltage $V_{bias}$. By dimensioning the bias resistance and the bias voltage appropriately, the maximum delay of the output pulse edge of the invertor can be limited and it can be set as desired when the control voltage $V_{cntrl}$ is zero. By adding the resistances of the bias resistances 47 and 48, the minimum frequency of the ring oscillator can be increased and the VCO coefficient of the oscillator reduced (a change in the frequency per given voltage change). This is obvious because when a value of the resistors 45 and 46 is changed, a change in the value of the parallel connection is not so great as a change of the values of said resistors. The bias resistances as well as the actual resistances limiting the discharge current are preferably carried out with FET transistors.

Figure 5:
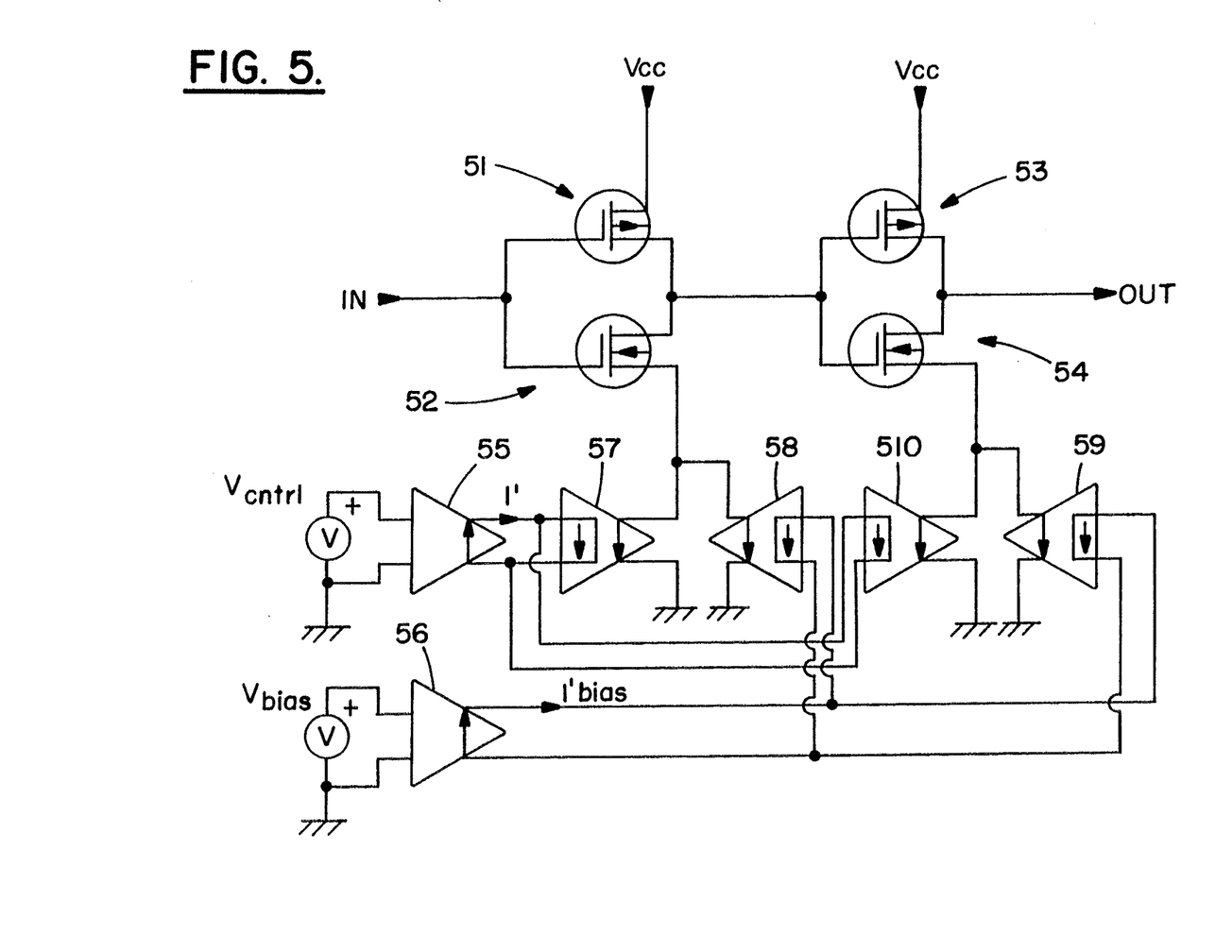
FIG. 5 illustrates schematically the principle of a third embodiment of controlling the delay.

A third embodiment shown in FIG. 5 presents a principle means for controlling the delay. In this method voltage controlled current sources (VCCS) 55 and 56 are used, the control voltage $V_{cntrl}$ of which is carried to element 55, resp., the bias control voltage $V_{bias}$ to element 56. Respectively, the VCCS element 55 converts its control voltage $V_{cntrl}$ into current I' equivalent thereto, said current serving as the control current for the current controlled current sources (CCCS) 57 and 510 used as actual controllers of the discharge current. Respectively, the VCCS element 56 converts its control voltage $V_{bias}$ into a current $I'_{bias}$ equivalent thereto, said current serving as the control current for the current controlled current sources (CCCS) 58 and 59 used as actual controllers of the biassing current. The minimum frequency of the ring oscillator can in this manner be increased and the VCO coefficient of the oscillator limited.

Figure 6:
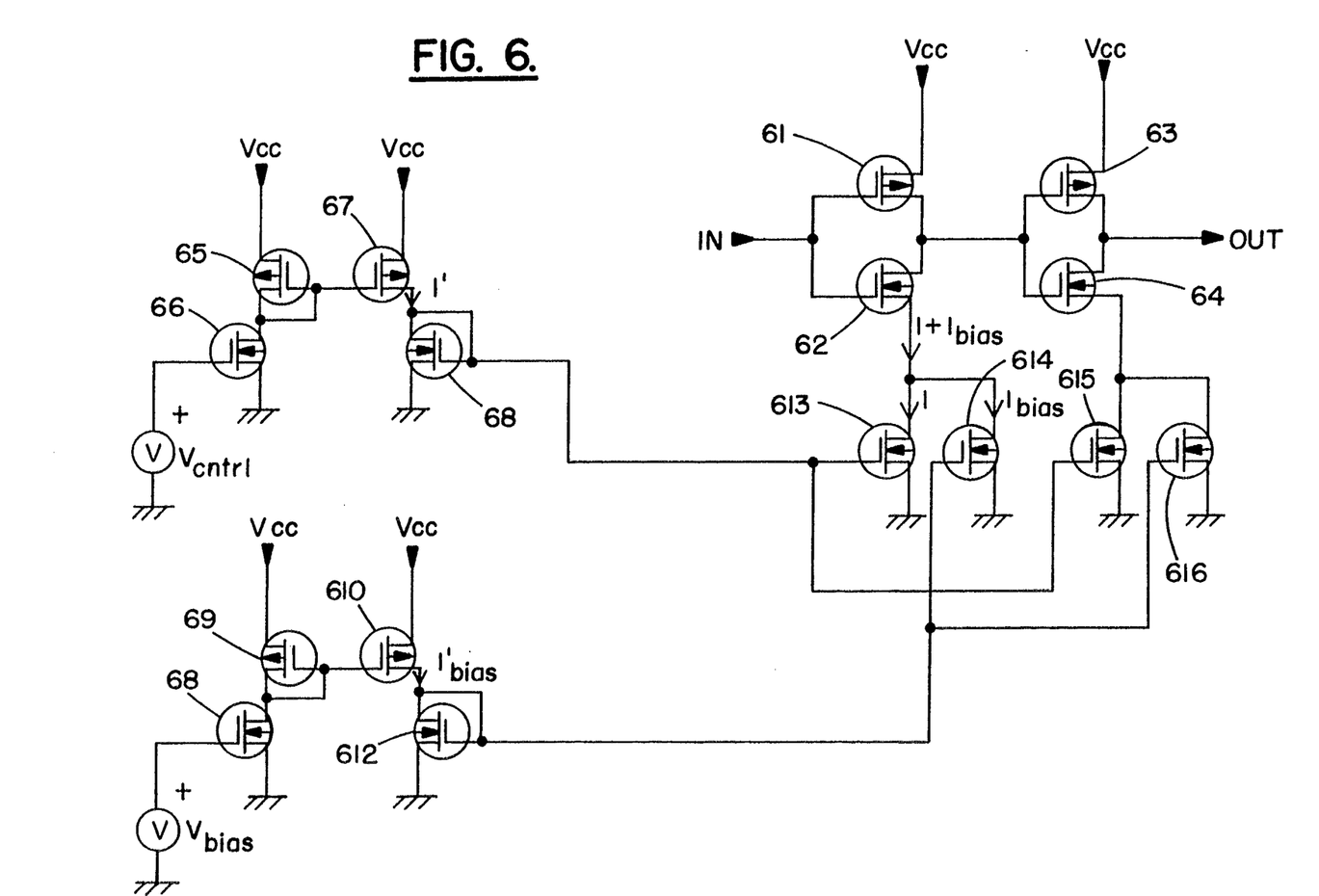
FIG. 6 presents a practical implementation of the third embodiment.

A potential implementation of the third embodiment of FIG. 5 is presented in FIG. 6. The current part I of the discharge current I+$I_{bias}$ of the invertor 61, 62 is studied. Control voltage $V_{cntrl}$ is carried to the gate of transistor 66 and it causes that the current passes through transistor 65 connected as a diode. Said current is reflected to transistor 67, whereby current I' of equal size in proportion to the voltage $V_{cntrl}$ passes there through. Thus, a change in the voltage $V_{cntrl}$ causes a change in the discharge current component I. The relation of currents I and I' is dependent on the proportions of the dimensions of the FET transistor channels.

The control of the bias component $I_{bias}$ of the discharge current functions in similar fashion. The bias control voltage $V_{bias}$ is carried to a gate of transistor 611 and it makes the current to pass through the transistor 69 connected as a diode, whereby current $I'_{bias}$ proportional to the voltage $V_{bias}$ passes through transistor 610. The transistors 612 and 614 serve as a current mirror so that the current $I'_{bias}$ passing through the transistor 610 is reflected into a current $I_{bias}$ passing through transistor 614 (and transistor 616). In this manner a change in voltage $V_{bias}$ causes a change in the component $I_{bias}$ of the discharge current. The components I and $I_{bias}$ together form the current with which the charge of the load capacitances of the invertors 61, 62 and 63, 64 is discharged. Said structure is integrated using CMOS technique on the same circuit together with the rest of the oscillator components.

Figure 7:
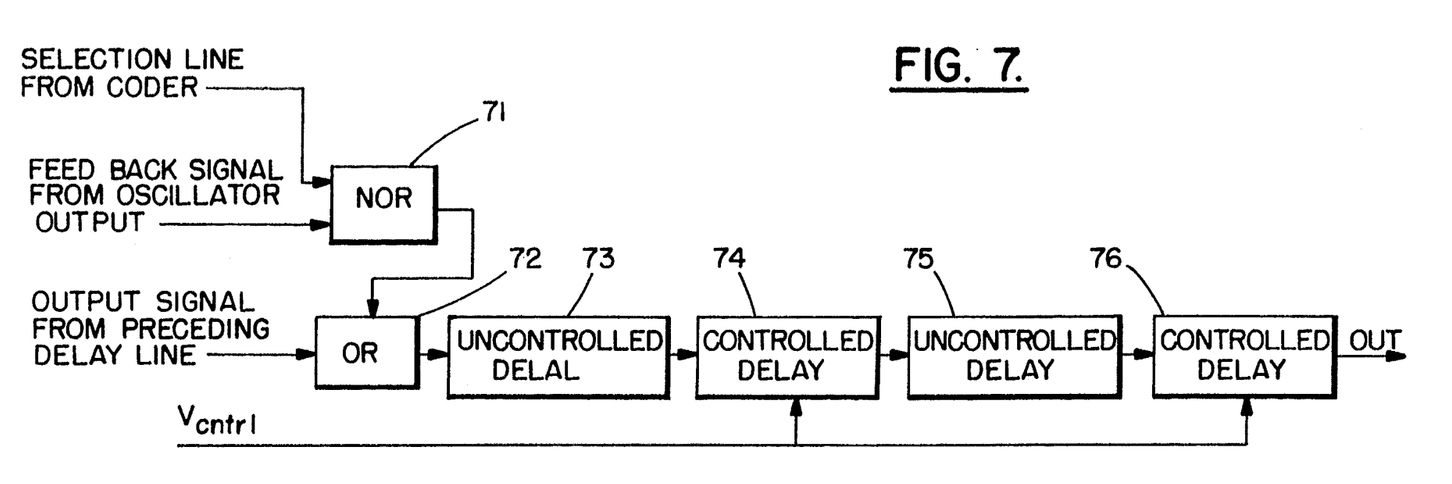
FIG. 7 illustrates a schematic circuit of one delay line.

FIG. 7 presents the structure of one delay block. The delay elements 74 and 76 are delay elements controlled as in FIG. 3, and elements 73 and 75 are ordinary non-regulated invertors. They are designed to "sharpen" the edges of the pulses entering thereto which have been rounded in a preceding element. In addition, the invertor 73 inverts the phase of the pulse of the OR element. Element 75 comprises two invertors, because of which it exerts no influence on the phase of the pulse. Elements 73 and 75 reduce the distortion and so improve the frequency purity of the oscillator. As mentioned on page 5, the inputs of each delay block are formed by a selection line from the coder, a feedback output signal from the oscillator, and an output signal of a preceding delay line.

Selection of the signal to be carried to the delay line takes place e.g. with gates 71 and 72 as shown in the figure. The feedback signal $f_{vco}$ and the state of the selection line form the inputs of the NOR gate 71. When the state of the selection line is in logical "1" state, the output of the gate is permanently logical "0". Hereby, the output of the OR gate is dependent on the output of the preceding delay line, i.e. the pulses from a preceding delay line are conducted to the delay line. On the other hand, if the state of the selection line is "0", the output of the NOR gate is an inverted output signal of the oscillator. Since only one of the selection lines at a time is in "0" state, the output of the preceding delay line is in "0" state so that the output of the NOR gate will provide the output signal for the OR gate 72 with the result that the first end of the delay chain will be before said delay block, and a ring is produced. Thus, according to the states of the selection lines, three delay chains of different lengths can be connected to the ring oscillator.

The oscillation frequency $f_{vco}$ of the ring oscillator is dependent on the added total delay T, of the controllable delay elements constituting the ring and of the other gates included in the ring so that $$f_{vco} = 1/2T_r.$$

Figure 8:
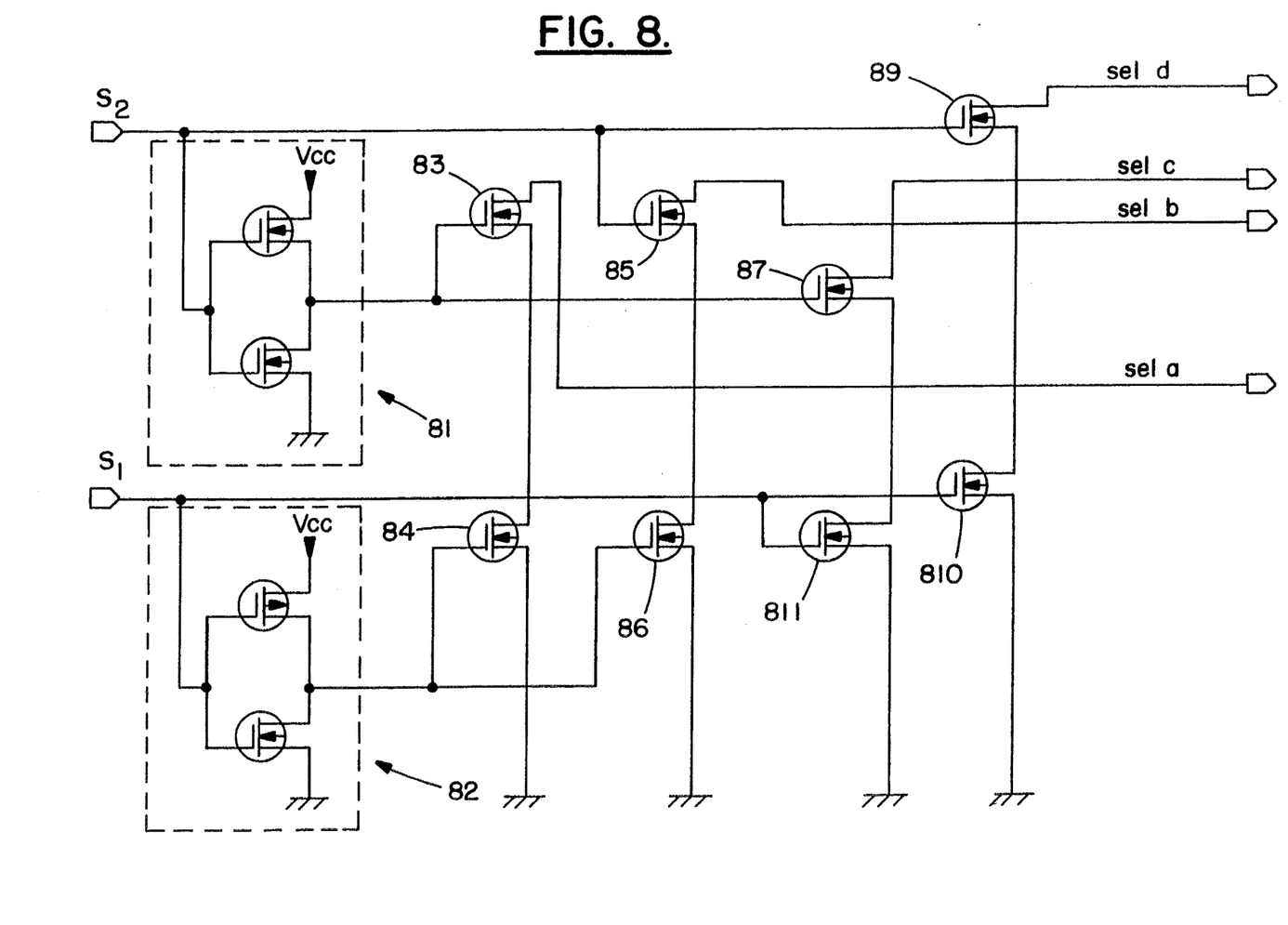
FIG. 8 presents the structure of the decoder.

Next, reference is made to FIG. 8 illustrating an opportunity for a coder 4 of the selection lines. The inputs of the coder are the lines $S_1$ and $S_2$, which may have two states; respectively, the outputs being the selection lines a, b, c and d, which also may have two logical states. The coder includes two invertors 81 and 82 and eight NMOS transistors serving as a switch. Each selection line is provided with a poor pull-up accomplished with FET to keep the line in "1" state unless connected by the decoder to "0" state. The coder in itself is known in the art and its structure is not included in the protective scope of the present invention. However, let us find out what the state of the selection lines is if $S_2$ vs "0" and $S_1$ is "1". The output of the invertor 81 is "1" and therefore the switches 83 and 87 are switched off and the state of the lines a and c is "1". The switch 810 is switched off, therefore the state of the line d is also "1". The switch 85 is switched on and the switch 86 is also on because the output of the invertor 82 is "0". Now the state of line b is the only "0".

Figure 9:
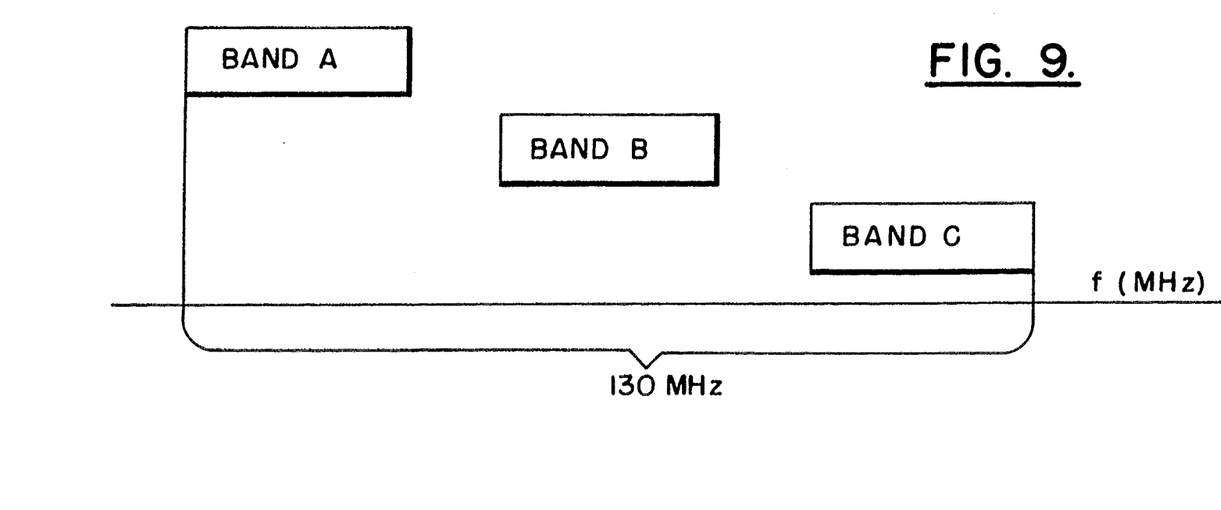
FIG. 9 illustrates the frequency ranges of the oscillator.

The oscillator ring as in FIG. 2 and as described related to FIG. 7 includes delay blocks 2 and 3 included in the ring of the oscillator, resulting in frequency range B in FIG. 9. Similarly, the other alternatives for forming frequency ranges A and C are easy to describe.

An embodiment of the present invention is described above in which the frequency band has been divided into three parts which can be selected with digital control. However, it will be clear to a person skilled in the art that modifications may be incorporated without departing from the scope of the present invention. For example, a greater or smaller number of partial chains than those described may exist, and one chain only may be used if a frequency control range of minor size is needed. Neither is the number of the invertors in any way limited. Both the invertor and the logic gate acting as the first component for each partial chain can be formed differently from the manner described above. A programmed divider can further be provided in a branch of a feedback output signal, whereby very low frequencies can be obtained. The ring oscillator described in the present invention enables the integration of the oscillator totally by means of CMOS technique on an IC circuit, which is not possible in oscillators provided with reactive components as those known in the art. When implemented with CMOS technique, the power consumption of the oscillator can be very small and moreover, the integration provides a good protection against external interferences.

We claim:

1. A controlled oscillator comprising a delay line in the form of a plurality of coupled delay elements, each delay element comprising a pair of coupled invertors;
    characterized in that a controllable resistance means is coupled between at least one invertor in each pair of coupled invertors and ground, such that the invertor will discharge through said resistance means, whereby the decay time of the invertor, and thus the oscillator frequency will be determined by the magnitude of the resistance means,
    wherein a controllable bias resistance means is coupled between the invertor and ground, in parallel with the controllable resistance means.

2. A controlled oscillator as claimed in claim 1, wherein the bias resistance means comprises a current source, the output current of which is substantially equal to the discharge current of the invertor when the current being transmitted by the controllable resistance means is substantially zero.

3. A controlled oscillator as claimed in claim 1, wherein the oscillator comprises a delay chain comprising a plurality of delay lines coupled in series, the output of the delay chain being coupled to each delay line as an input, to form a plurality of oscillator rings of different lengths, each delay line having an additional input from a selection controller which controls which delay line the delay chain output is supplied to and as such determines the length of the oscillator ring utilized.

4. A controlled oscillator as claimed in claim 3, wherein the selection controller comprises a coder an output from which is a coupled to each delay line, the output from the coder determining whether or not the delay line is activated to form part of the delay chain.

5. A controlled oscillator as claimed in claim 4, wherein each delay line comprises a switching means comprising a NOR gate the inputs of which are an output from the coder and the output from the delay chain, and an OR gate the inputs of which are the output of the NOR gate and the output of the previous delay line in the delay chain, the output of the OR gate being input to the first invertor in the delay line.

6. A controlled oscillator as claimed in claim 3, wherein in the feedback loop of the oscillator said additional input from said selection controller is an external control word that controls which delay line the delay line chain output is supplied to and thereby controls the operating frequency range of the oscillator, said selected operating frequency range being a division of the entire frequency range of said oscillator.

* * * * *